United States Patent
Cayaban et al.

(10) Patent No.: US 8,173,909 B2
(45) Date of Patent: May 8, 2012

(54) METHOD FOR MATING FLEXURE TO FLEX-PRINT CIRCUIT AND FLEXURE THEREFOR

(75) Inventors: Alex Enriquez Cayaban, Fremont, CA (US); Vladimir Aleksic, Saratoga, CA (US); Shuichi Wakaki, Cupertino, CA (US)

(73) Assignee: Nitto Denko Corporation, Osaka (JP)

( * ) Notice: Subject to any disclaimer, the term of this patent is extended or adjusted under 35 U.S.C. 154(b) by 962 days.

(21) Appl. No.: 11/875,422

(22) Filed: Oct. 19, 2007

(65) Prior Publication Data

US 2008/0099236 A1    May 1, 2008

Related U.S. Application Data

(60) Provisional application No. 60/854,486, filed on Oct. 25, 2006.

(51) Int. Cl.
*H05K 1/11* (2006.01)
*G11B 5/48* (2006.01)
*G11B 21/16* (2006.01)
*G11B 5/60* (2006.01)
*G11B 15/64* (2006.01)
*G11B 17/32* (2006.01)
*G11B 21/20* (2006.01)

(52) U.S. Cl. .................. 174/263; 360/245.9; 360/234.5

(58) Field of Classification Search .................. 361/245, 361/749; 174/263, 254, 260; 360/245.8, 360/245.9, 234.4, 234.5, 264.2
See application file for complete search history.

(56) References Cited

U.S. PATENT DOCUMENTS

| | | | |
|---|---|---|---|
| 6,394,819 B1 * | 5/2002 | Mosser et al. | ................. 439/83 |
| 6,396,665 B1 * | 5/2002 | Asano | ....................... 360/264.2 |
| 6,483,669 B1 | 11/2002 | Krinke | |
| 6,576,148 B1 | 6/2003 | Shum et al. | |
| 6,944,936 B2 | 9/2005 | Krinke | |
| 7,518,830 B1 * | 4/2009 | Panchal et al. | ............. 360/245.8 |
| 2004/0037007 A1 | 2/2004 | Rugg et al. | |
| 2006/0087011 A1 | 4/2006 | Kanagawa et al. | |
| 2006/0158784 A1 | 7/2006 | Arya et al. | |
| 2008/0277142 A1 | 11/2008 | Kanagawa et al. | |
| 2011/0119911 A1 | 5/2011 | Kanagawa et al. | |

FOREIGN PATENT DOCUMENTS

JP   61-248495   11/1986
JP   2006-120863   5/2006

OTHER PUBLICATIONS

International Search Report dated Mar. 27, 2008 for International Application No. PCT/US07/22658.
Chinese Office Action issued in Chinese Patent Application No. 200780040093.9, dated Nov. 29, 2010.
Notification of Reasons for Refusal, dated Oct. 6, 2011, in JP2009-534662.

* cited by examiner

*Primary Examiner* — Timothy Thompson
*Assistant Examiner* — Roshn Varghese
(74) *Attorney, Agent, or Firm* — Sughrue Mion, PLLC

(57) ABSTRACT

Inspection windows are cut or formed into the tail section of the flexure circuit tail in a hard disk drive Head Gimbal Assembly (HGA), or CIS, to enable visual inspection of the alignment of the CIS to the head preamp circuit, or FPC. The holes are made in the steel backing and base polyimide, and are positioned between adjacent conductive pads. In addition to facilitating visual inspection, the windows also enable rework of solder. Additionally, solder wicking holes may also be provided in the conductive pads and/or the polyimide and steel backing.

20 Claims, 13 Drawing Sheets

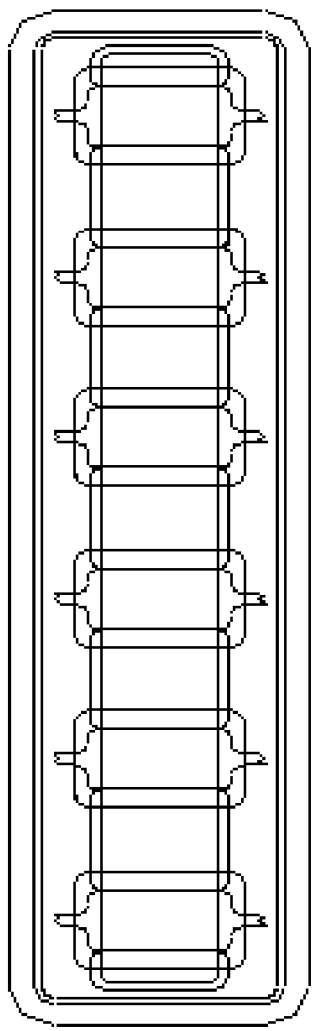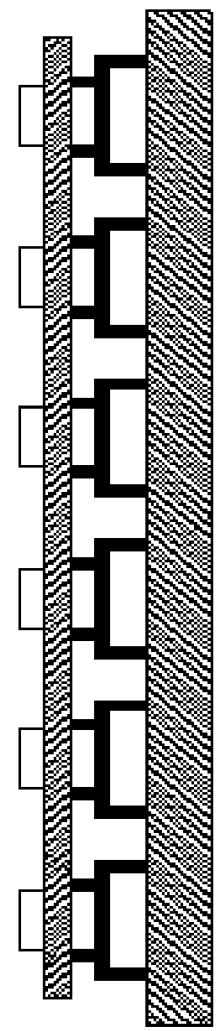
Figure 2c
Prior Art

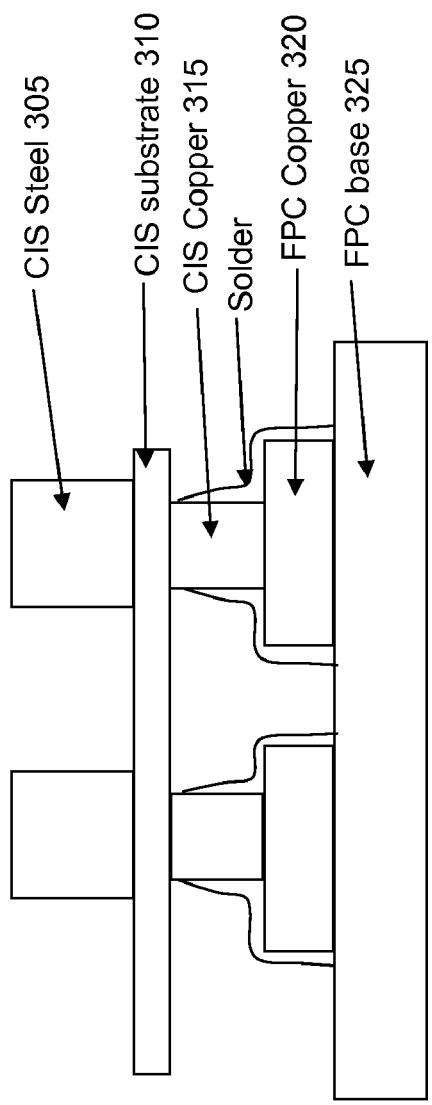
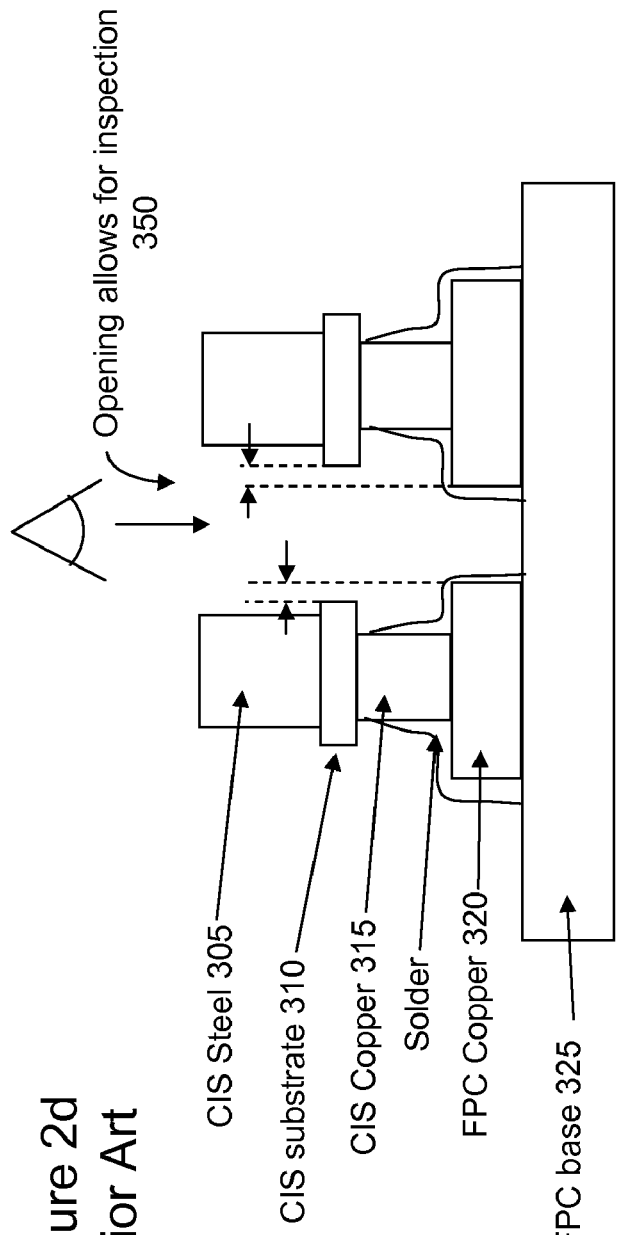

CIS WINDOW LEADS (OPEN AREAS)

PREVIOUS ART: VISUAL INSPECTION OBSCURED

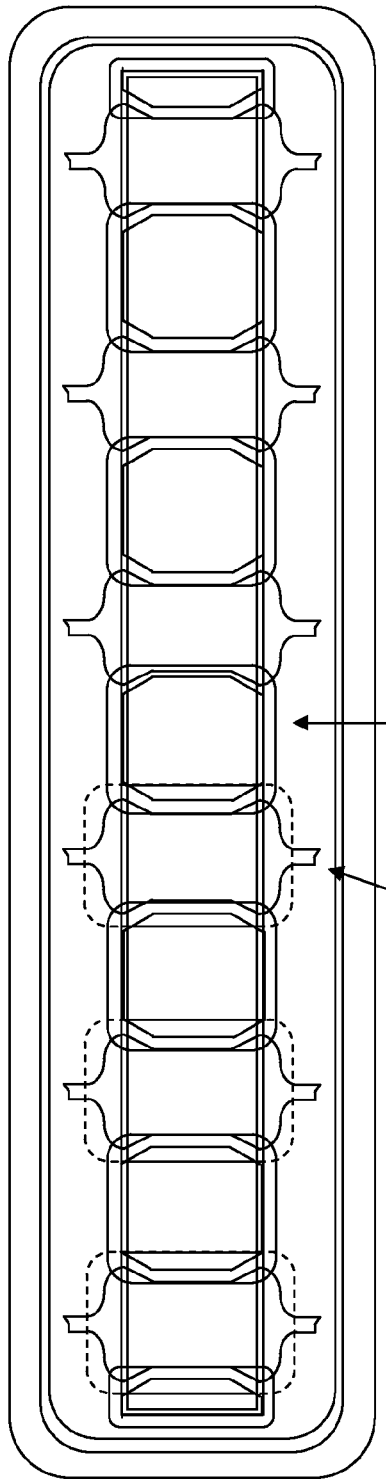
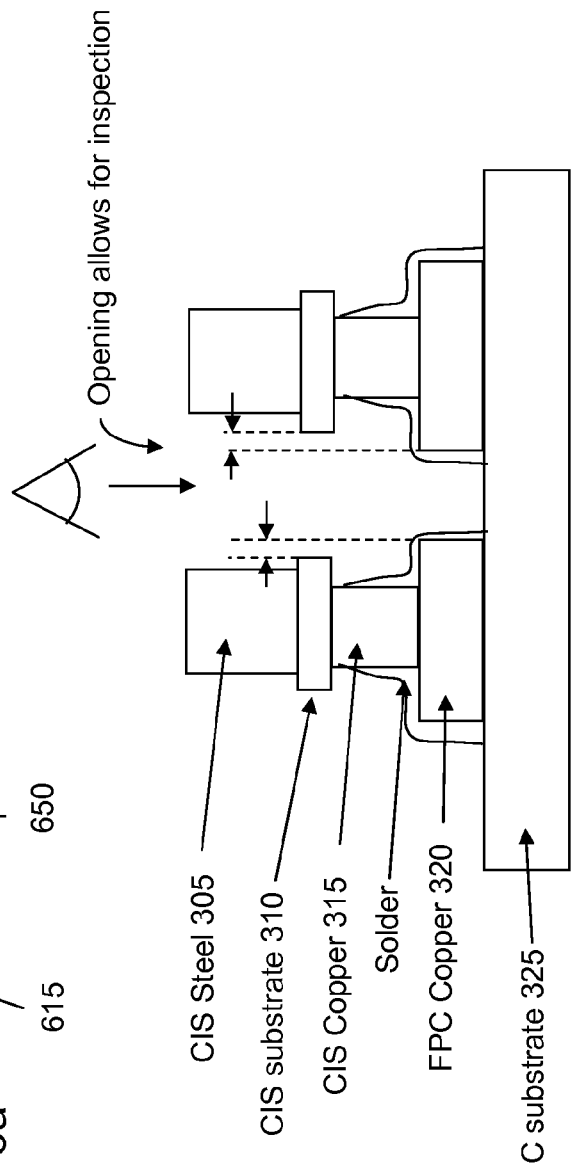
Figure 6a
Figure 6b

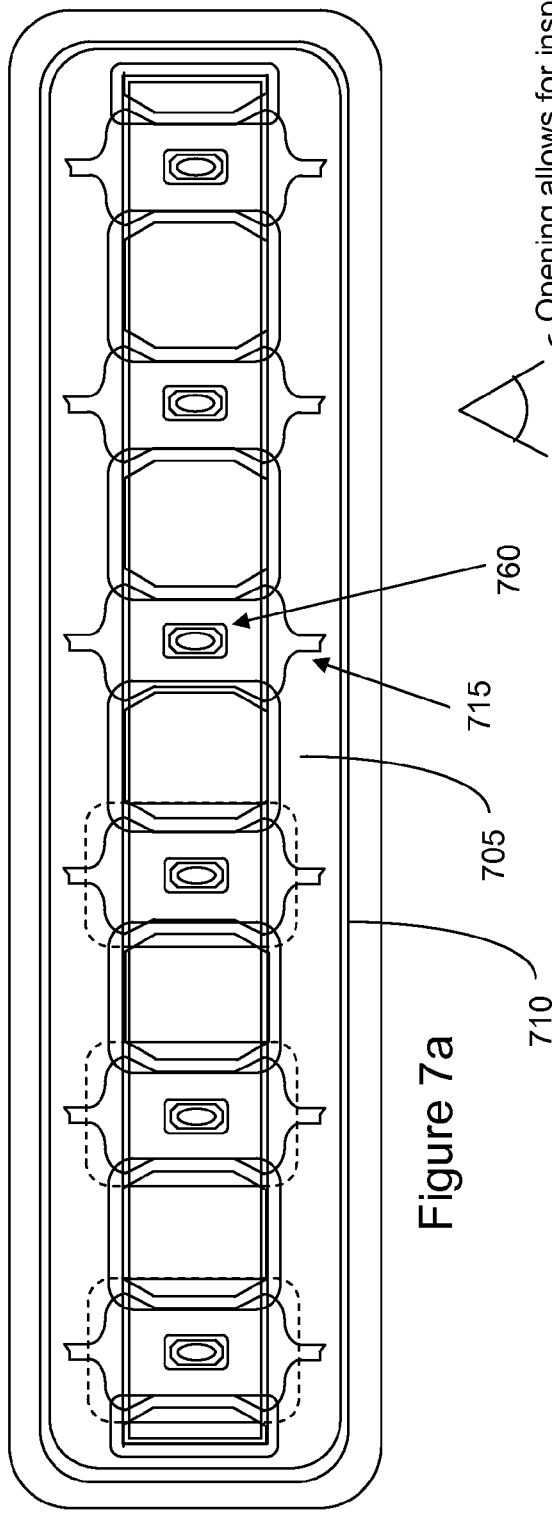
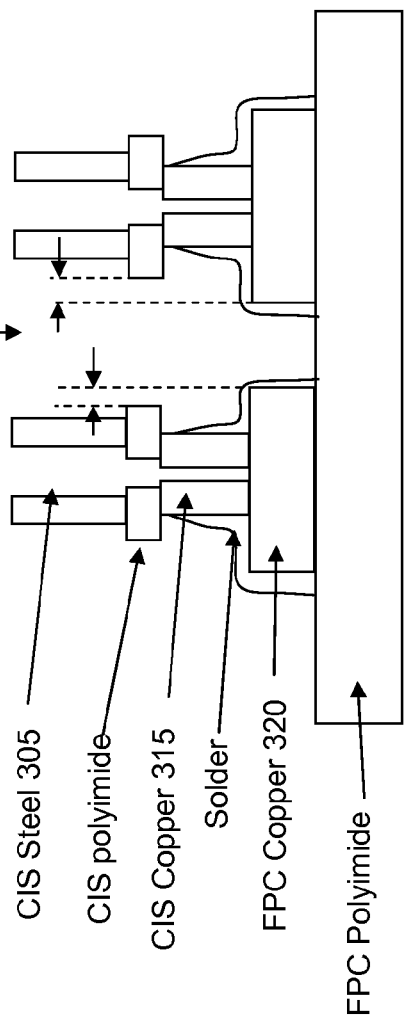
Figure 7a
Figure 7b

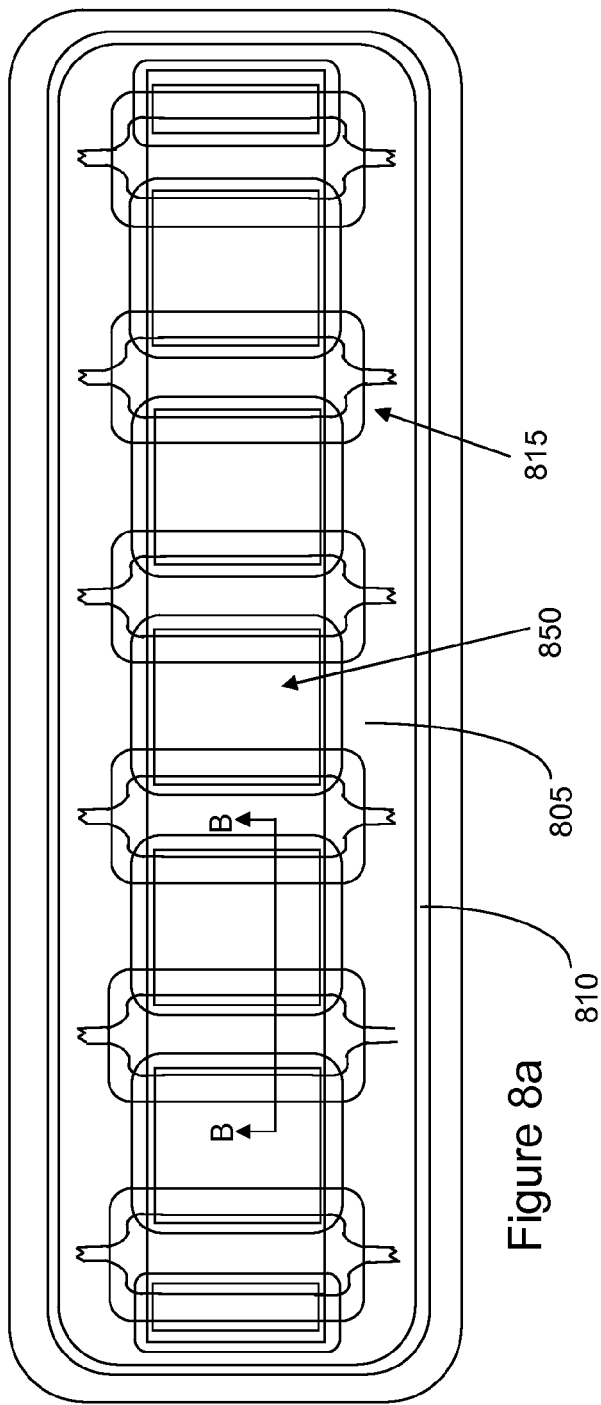
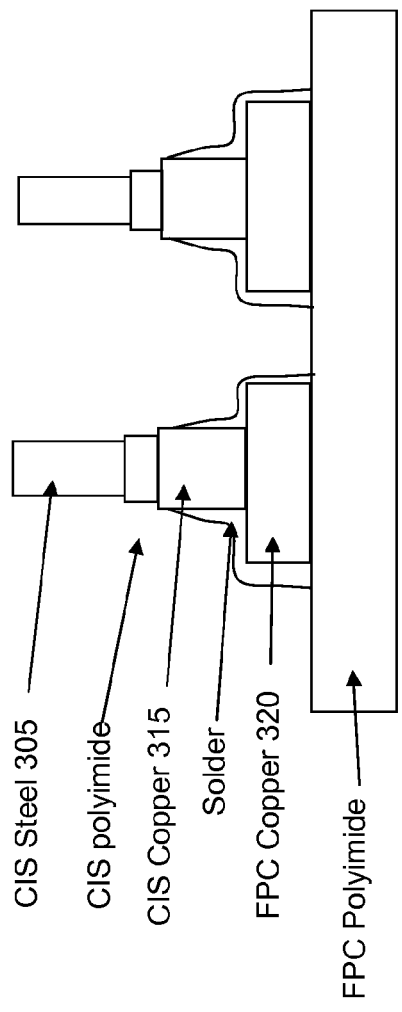
Figure 8a
Figure 8b

METHOD FOR MATING FLEXURE TO FLEX-PRINT CIRCUIT AND FLEXURE THEREFOR

RELATED APPLICATIONS

This application claims priority from U.S. Provisional Application Ser. No. 60/854,486, filed Oct. 25, 2006, the disclosure of which is incorporated herein by reference in its entirety.

BACKGROUND

1. Field of the Invention

This invention relates to manufacturing of hard disk drives (HDD) and, more particularly, to assembly, manufacturing and inspection of hard disk drive components.

2. Description of Related Art

FIGS. 1a and 1b depict a hard drive suitable for implementing embodiments of the subject invention. FIG. 1a depicts the hard drive 100 with the cover removed, while FIG. 1b depicts an enlarged image of the preamp area of the hard drive 100. The hard drive 100 uses rotating platters (disks) 110 to store data. Each platter is rotated by a spindle (not shown) and has a smooth magnetic coated surface on which digital data is stored. Information is written to the disk by applying a magnetic field from a read-write head (not shown) that is attached to an actuator arm 120. For reading, the read-write head detects the magnetic flux emanating from the magnetic bits that were written onto the platter. Since the signals from the read/write head is very faint, a preamp 130 is provided in close proximity to the head. The preamp 130 is a chip that is mounted on a substrate 140. The substrate 140 is mounted onto a carrier plate 150, that connects to the actuator arm assembly 120. The flexible circuit loop 160 is connected to the substrate 140, to transfer signals between the preamp 130 and the associated electronics (not shown). The associated electronics control the movement of the actuator and the rotation of the disk, and perform reads and writes on demand from the disk controller.

The read/write signal transmission between the pre-amp 130 and the read-write heads, is also done over a flexible circuit, generally referred to in the industry as "flexure" with a family of traces. The flexure is not shown in FIG. 1a, but part of it, 170, is shown in FIG. 1b. The flexure 170 is connected, e.g., soldered, to a Flexible Printed Circuit (FPC) 180, which in turn connects to the pre-amp 130.

The flexure technology is well known in the art as a suspension component to propagate the signal between the circuit board and the magnetic head when writing and reading to the disk. The characteristics required for flexures used in hard disk drives are low stiffness, high electrical conductivity, and high accuracy. In general, there are two types of manufacturing processes for flexures: additive and subtractive. In the additive type manufacturing an insulating layer (e.g., a polyimide) is provided over a base layer (e.g., stainless steel) and a conductor layer (e.g., copper) is deposited on top of the insulating layer.

This type of flexure is generally referred to as 'CIS' (Circuit Integrated Suspension). In the subtractive type of manufacturing, a tri-laminate sheet having a base layer (e.g., stainless), an insulating layer (e.g., polyimide) and a conductor layer (e.g., copper) is the starting material. Using techniques such as etching the various elements of the flexure are defined. This type of flexure is generally referred to as 'ILS' (Integrated Laminate Suspension) or 'TSA' (Trace Suspension Assembly).

In this document, the term Flexible Printed Circuit (FPC) refers to the dynamic flex circuit connected to the pre-amp; while flexure (also referred to as CIS (Circuit Integrated Suspension)) refers to the connecting circuit used to transmit the signals between the read/write heads and the pre-amp.

In the prior art it is known to solder or bond copper conductors of the FPC, to copper conductors of the flexure tail. Due to the small sizes of the conductors, it is very critical that the conductors of the FPC and the flexure be aligned properly. However, in the prior art once the flexure is laid upon the FPC, it is sometimes not possible to visually inspect the alignment of the conductors. Poor alignment may result in shorts (solder bridging) between adjacent conductors or opens. Additionally, once the two parts are bonded or soldered, there is no possibility to inspect the integrity of the bonding and/or to make any repairs.

FIG. 2a is a top view of the prior art CIS over FPC in proper alignment, while FIG. 2b is a semi-exploded view of the CIS and FPC before soldering. In FIG. 2a, all layers are shown as transparent to enable better understanding of the layout. In FIG. 2b, the CIS copper layer 315 is exploded away from its base substrate 310 for illustration purposes. FIG. 2c illustrates a top view and a corresponding cross-section view of the prior art assembly, while FIG. 2d is a cross-section at line A-A of FIG. 2a, illustrating the prior art layout. As can be seen from these Figures, the proper alignment of the CIS and FPC cannot be verified, and errors cannot be corrected.

Other background information can be found in, e.g., U.S. Pat. Nos. 5,955,176 and 6,399,899.

SUMMARY

Various embodiments of the subject invention facilitate visual inspection of mated FPC/flexure parts and enable rework of solder bridging between adjacent conductors should they occur. The various embodiments of the invention are applicable to both CIS, ILS and TSA flexure circuits. According to various embodiments of the invention, small windows (or openings) are cut or formed into the base polyimide between adjacent conductors to facilitate visual inspection and rework of solder. This will allow visual inspection and also allow the rework of pieces that would otherwise be scrapped.

According to aspects of the invention, a flexible circuit is provided, comprising: a steel backing layer; an insulating layer provided over the steel backing layer; a conductive circuitry provided over the polyimide layer; and inspection cutouts provided in the steel backing layer and in the insulating layer, the cutouts located to enable visual inspection of selected areas of the conductive circuitry. The steel backing layer may comprise stainless steel. The insulating layer may comprise polyimide. The conductive circuitry may comprise copper. The flexible circuit may further comprise solder-wicking holes provided in the conductive circuitry. The conductive circuitry may comprise conductive pads and the insulating layer may be slightly narrower than the conductive pads.

According to other aspects of the invention, a combination flexible circuit and flexible printed circuit (FPC) is provided, comprising: a flexible circuit comprising a steel backing layer, an insulating layer provided over the steel backing, and conductive pads provided over the insulating layer; an FPC comprising FPC insulating layer and FPC conductive pads; wherein selected conductive pads are soldered to corresponding FPC conductive pads, and wherein inspection cutouts are provided in the steel backing layer and in the insulating layer to enable visual inspection of at least some of the conductive pads that are soldered to corresponding FPC conductive pads.

According to further aspects of the invention a method for manufacturing flexible circuit is provided, comprising: providing steel backing layer; providing an insulating layer over the steel backing layer; providing a plurality of contact pads over the insulating layer; and providing cutouts in the insulating layer to enable visual inspection of at least some of the plurality of contact pads.

According to yet further aspects of the invention, a method for manufacturing a combination of flexible circuit and flexible printed circuit FPC is provided, comprising: providing a steel backing layer; providing an insulating layer over the steel backing layer; providing a plurality of contact pads over the insulating layer; providing cutouts in the insulating layer to enable visual inspection of at least some of the plurality of contact pads; providing an FPC comprising FPC insulating layer and FPC conductive pads; soldering at least selected conductive pads to corresponding FPC conductive pads; inspecting the quality of the soldering via the cutouts.

According to further aspects of the invention, in the flexible circuit the conductive circuitry may comprise conductive pads and the cutouts may be sized so as to expose edges of the conductive pads. The cutouts may be rectangular, circular, or other suitable shape.

According to further aspects of the invention, a method for manufacturing flexible circuit is provided, comprising: fabricating a combination of insulation layer sandwiched between a backing layer and a conductive pads layer; fabricating cut-out holes in the combination to enable visual inspection of the conductive pads layer from the backing layer side. The cut-out holes are cut in the backing layer and in the insulation layer. The method may further comprise fabricating solder-wicking holes in the conductive pads layer.

BRIEF DESCRIPTION OF THE DRAWINGS

FIG. 2a is a top view of the prior art CIS over FPC in proper alignment, while

FIG. 2c illustrates a top view and a corresponding cross-section view of the prior art assembly, while FIG. 2d is a cross-section at line A-A of FIG. 2a, illustrating the prior art layout.

FIG. 3a is a top view of an CIS over FPC in proper alignment according to an embodiment of the invention, while

FIG. 4 is a cross section along line B-B of FIG. 3a.

FIG. 5a illustrates the flexure tail of the prior art, while FIG. 5b illustrates an embodiment of the flexure tail according to the subject invention.

FIGS. 6a and 6b depict another embodiment of the invention, incorporating Nitto Denko's dog-bone shaped contact pads.

FIGS. 7a and 7b depict another embodiment wherein solder-wicking holes are used.

FIGS. 8a and 8b depict yet another embodiment of the invention using exposed edge.

DETAILED DESCRIPTION

Figure 1A:
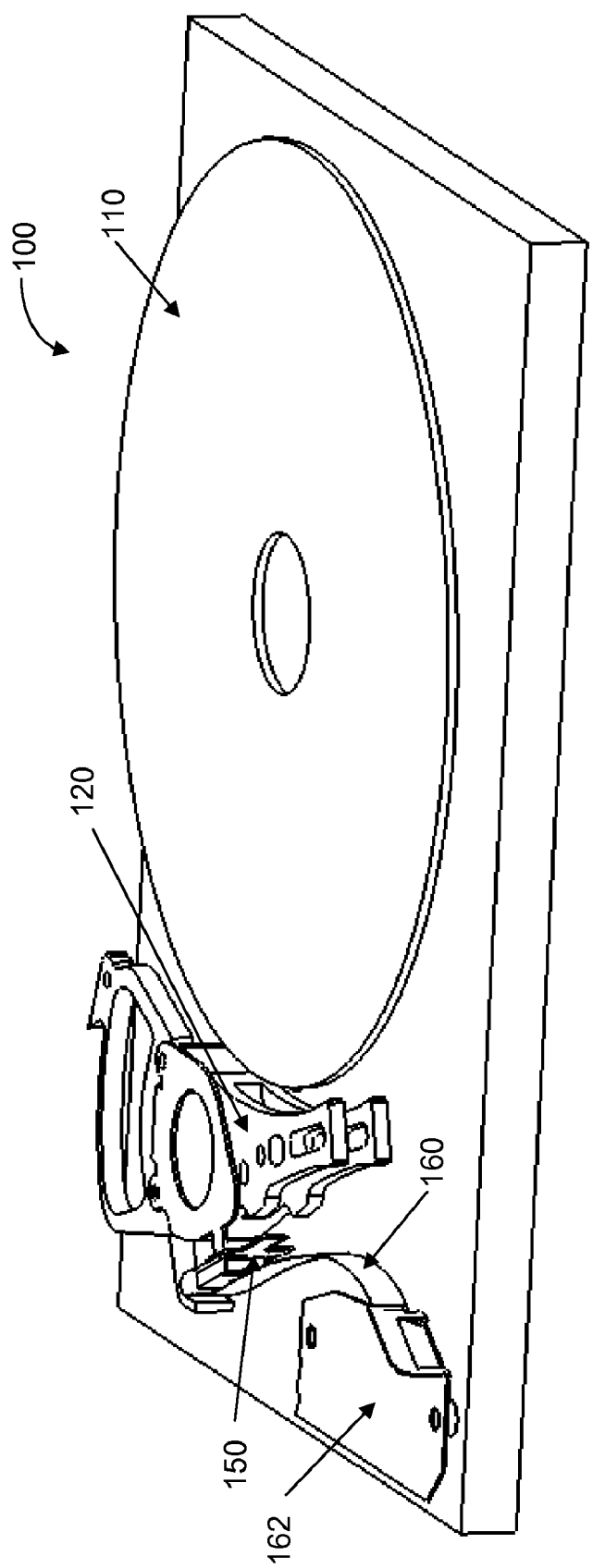
FIGS. 1a-1b depict a hard drive suitable for implementing embodiments of the subject invention.
Figure 1B:
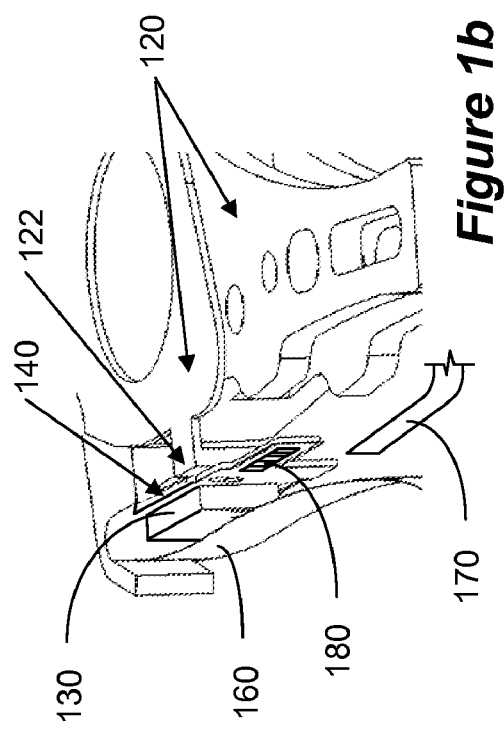
Figure 2A:
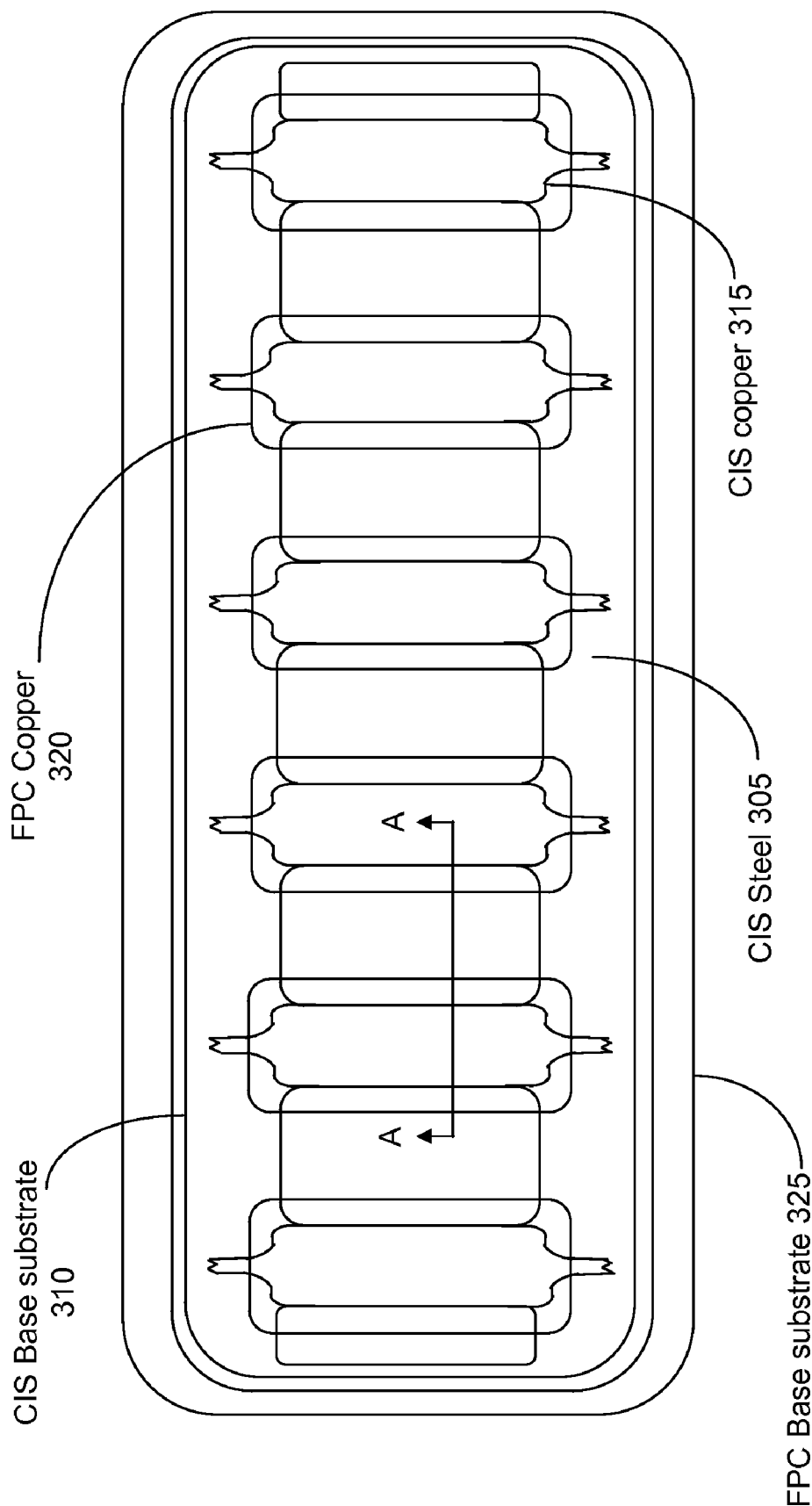
Figure 2B:
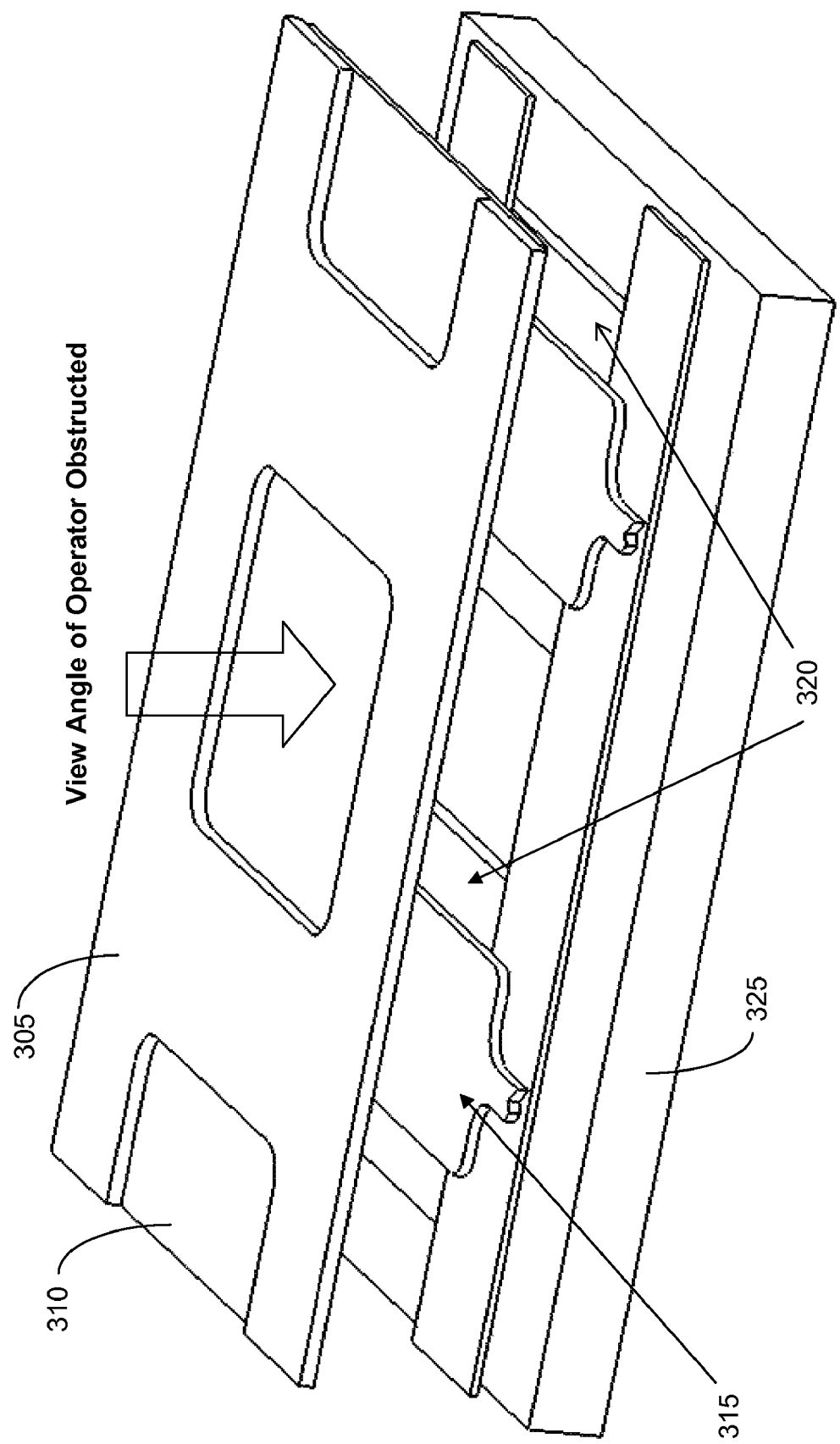
FIG. 2b is an exploded view of the CIS and FPC before soldering.
Figure 3A:
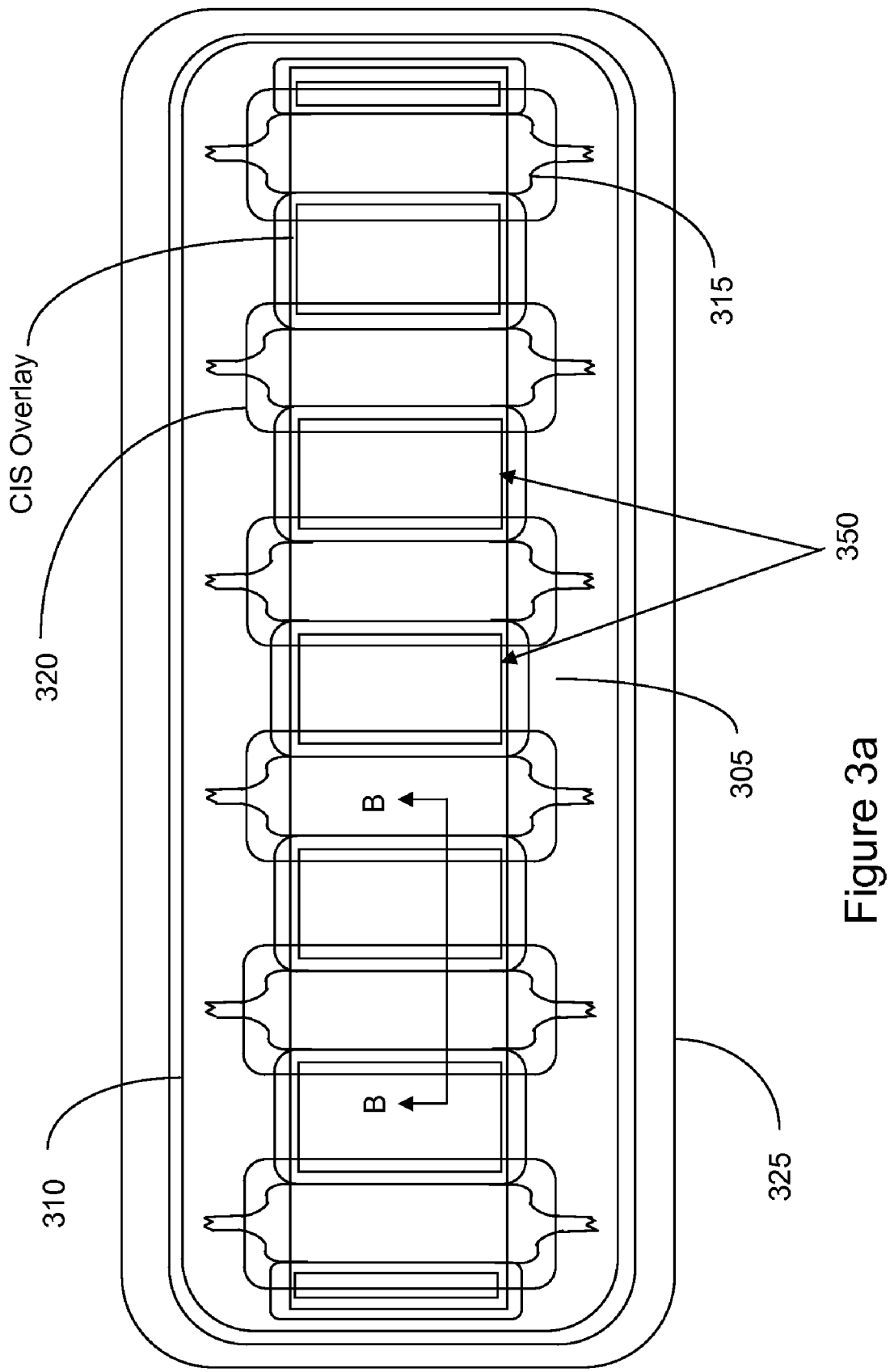
Figure 3B:
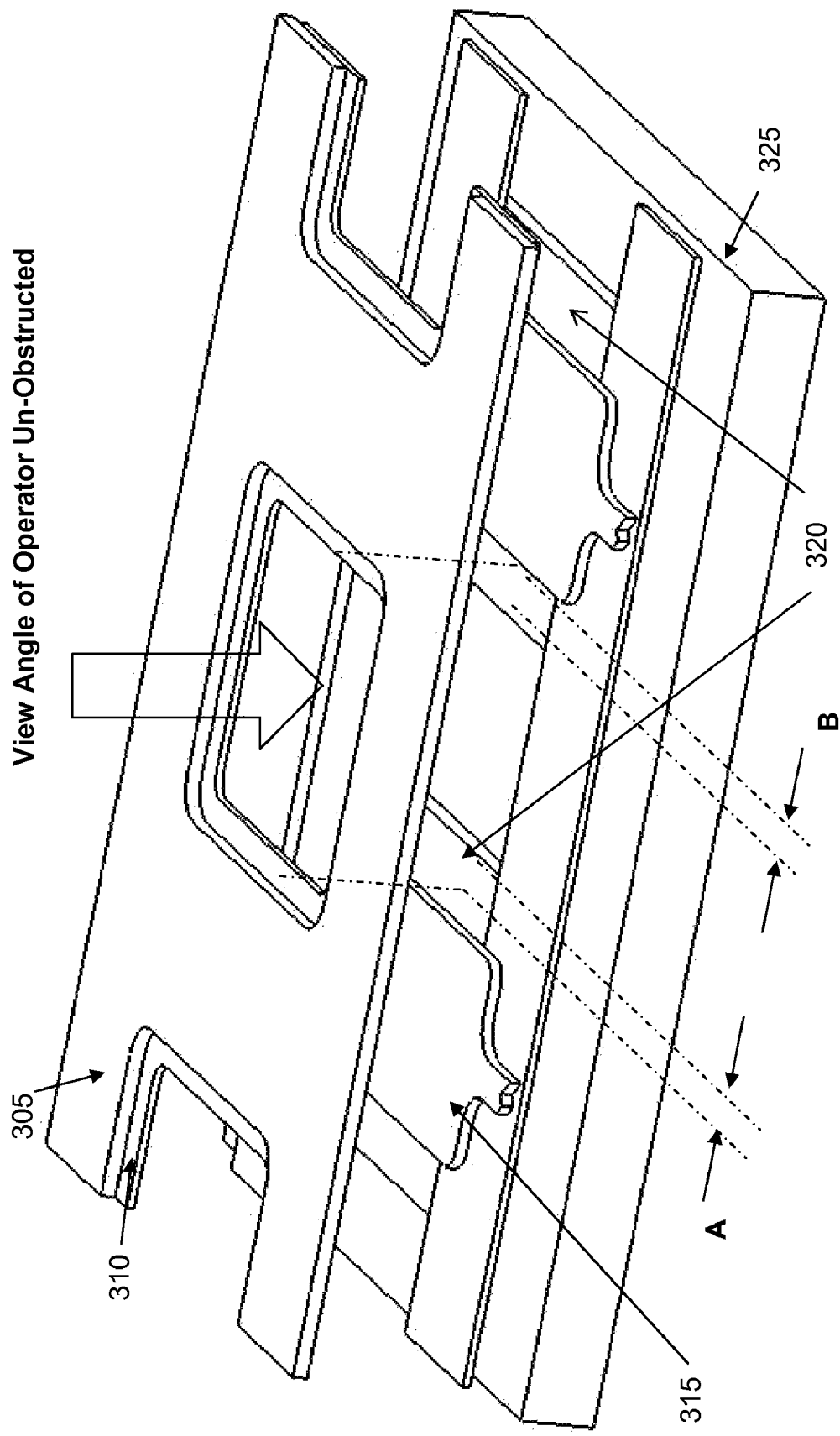
FIG. 3b is a semi-exploded view of the CIS and FPC according to an embodiment of the invention.

FIG. 3a is a top view of a CIS over FPC in proper alignment according to an embodiment of the invention, while FIG. 3b is a semi-exploded view of the CIS and FPC according to an embodiment of the invention. As shown, the CIS flexure of this embodiment comprises a sandwich of steel upper layer 305 (e.g., stainless steel), an insulating substrate 310, e.g., polyimide layer, and a plurality of conducting contacts 315, e.g., copper traces. The contacts 315 need to be aligned with and connected to the FPC contacts 320, which are generally also copper traces. The FPC contacts 320 are provided over the FPC substrate 325. These described elements are similar to the elements of the prior art FPC and flexure. However, unlike the prior art, as shown in FIGS. 3a and 3b, windows or cut-outs 350 are made in the CIS substrate 310 corresponding to and aligned with windows or cut-outs in the CIS steel layer 305. This enables visual inspection of the alignment of the flexure contacts 315 and FPC contacts 320. Additionally, the openings 350 enable inspection after bonding or soldering is completed and making repairs if necessary.

FIG. 4 is a cross section along line B-B of FIG. 3a, illustrating the opening and visual inspection. As can be seen in FIGS. 3b and 4 (see measurement arrows A and B), the openings are made sufficiently wide so to expose part of the FPC contacts once the flexure is mated to the FPC. In this manner, verification of proper alignment can be easily made and access is provided for any necessary repairs. For example, one may check to see that measurement A equals measurement B, inferring that the copper to copper alignment exists.

Figures 5A, 5B:
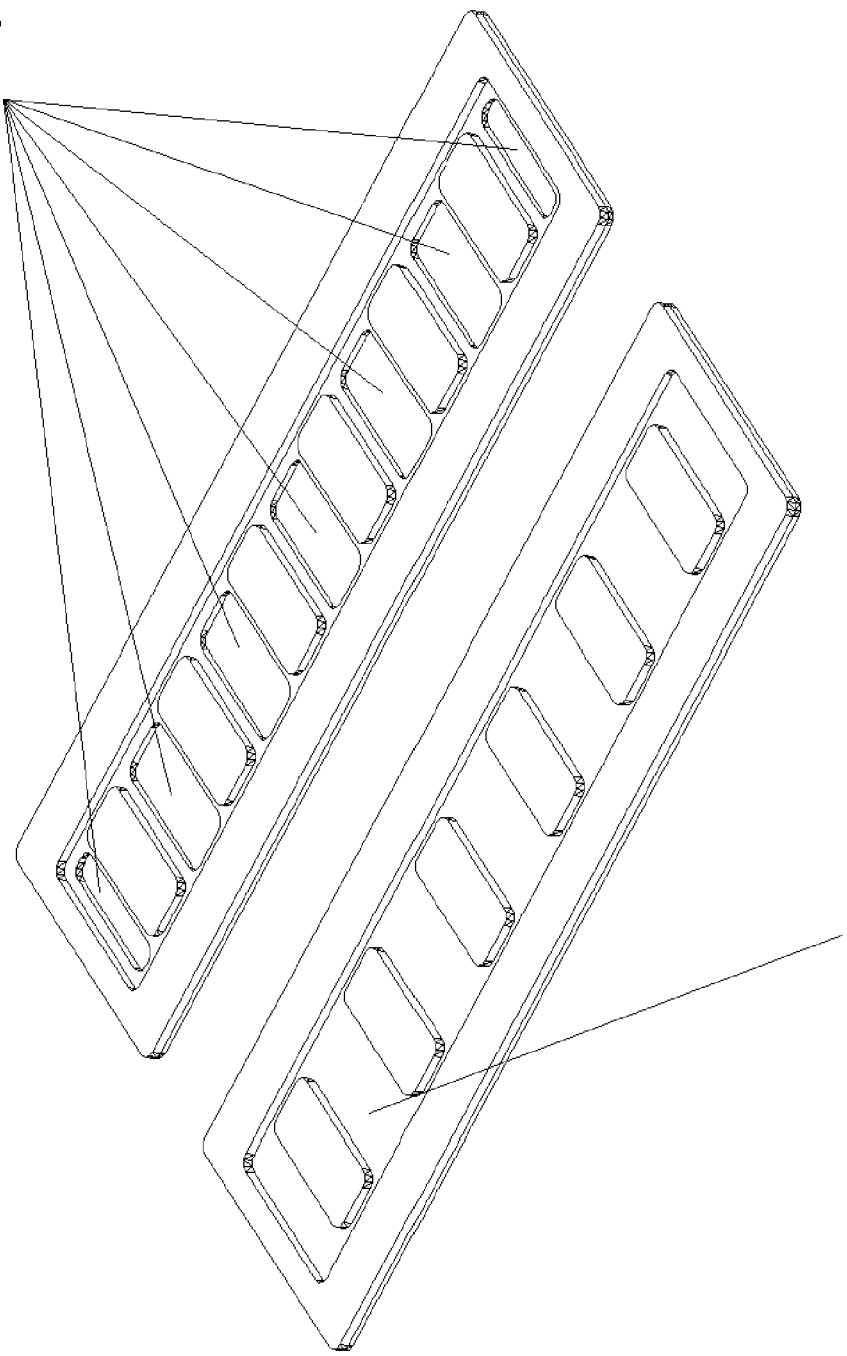

FIG. 5a illustrates the flexure of the prior art, wherein the polyimide layer 310 obstructs the view for any visual inspection. FIG. 5b, on the other hand, illustrates an embodiment of the flexure according to the subject invention enabling inspection and repair. Comparison of the flexures of FIGS. 5a and 5b clearly reveals the difference between the two for a better understanding of the benefits of the inventive flexure. That is, in FIG. 5b, windows 350 are cut in the polyimide layer so that one can inspect the alignment of the contacting pads.

FIGS. 6a and 6b depict another embodiment of the invention. This embodiment incorporates the "dog bone" pad variation. This embodiment is essentially the same as the basic configuration illustrated in FIGS. 3a and 3b, except that the flexure incorporates Nitto Denko's unique "dog-bone" shaped contact pads 615. In FIGS. 6a and 6b, elements similar to that of FIGS. 3a and 3b are indicated with the same reference, except that they are in the 6xx series. As can be seen from FIG. 6b, the windows enable validation of the alignment and access for repairs if necessary, just as with the previous embodiment. In this embodiment, the windows 650 are shaped in a manner enabling the dog-bone shape of the contact pads 615 to remain unexposed. However, other shapes are possible and some of the shapes may expose part of the contact pads.

FIGS. 7a and 7b depict another embodiment wherein solder-wicking holes 760 are used. Elements in FIGS. 7a and 7b which are similar to elements of other embodiments are indicated using same references, except that they are in the 7xx series. It should be appreciated that while this solder-wicking embodiment is illustrated in conjunction with the dog-bone feature, it may be implemented using any of the other embodiments implementing the invention and does not require the dog-bone shaped contact pads. Alternate shapes and sizes of holes 760 can be considered to be within the spirit and scope of the present invention.

As shown in FIGS. 7a and 7b, small holes 760 are provided in the contact pads 715 to allow the solder to wick through to enhance the strength of the solder joint. In one embodiment, the solder-wicking holes are provided only in the contact pads 715; however, in the embodiment illustrated in FIGS. 7a and 7b slightly larger holes are also provided in the substrate 710 and the steel-backing layer 705. This provides space for excess solder and allows for inspection of the alignment and integrity of the solder. If steel backing is used, it is recommended to isolate the steel into small "islands" to help minimize potential shorting between the wicked solder and the steel. This embodiment is particularly beneficial for "double-sided" parts. Double-sided refers to flexures in which there are exposed conductors from both sides of the base polyimide substrate. By providing these steel "islands," the conventional hot-bar may be used for soldering, while minimizing shorts.

FIGS. 8a and 8b depict yet another embodiment of the invention using exposed edge. Elements in FIGS. 8a and 8b which are similar to elements of other embodiments are indicated using same references, except that they are in the 8xx series. In this embodiment, the supporting base polyimide 810 is slightly narrower than the width of the copper pads 815. The windows 850 in the metal and the polyimide are made large enough so as to visually expose the edges of contact pad 815 of the CIS. To prevent potential shorting of the copper pads 815 to steel edge 805, the copper pad is flared at the extremities of the pad's length. The advantage of this variation is that the solder connection between FPC and flexure can be seen at the flexure pad edges. If steel backing is used, it is recommended to reduce the width of the steel support to help minimize the risk of shorting the reflowed solder to the steel "spine". This variation is also beneficial for "double-sided" parts.

Figure 9:
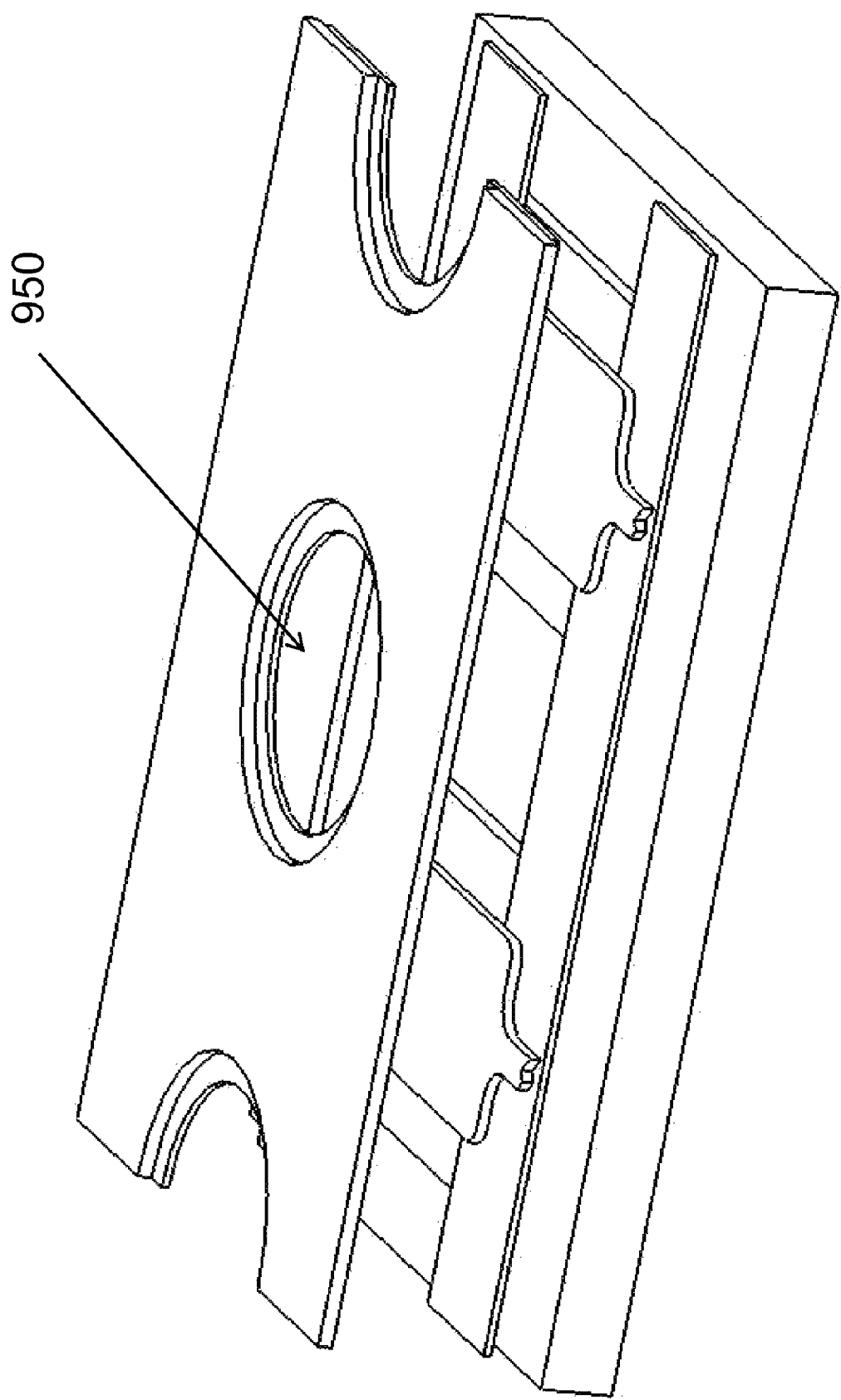
FIG. 9 depicts an example wherein the window is circular or oval.

In the various embodiments shown, the inspection window or cut out is shown square. However, other shapes, such as a circular hole, may be used. FIG. 9 depicts an example wherein the inspection window 950 is circular or oval.

Figure 10:
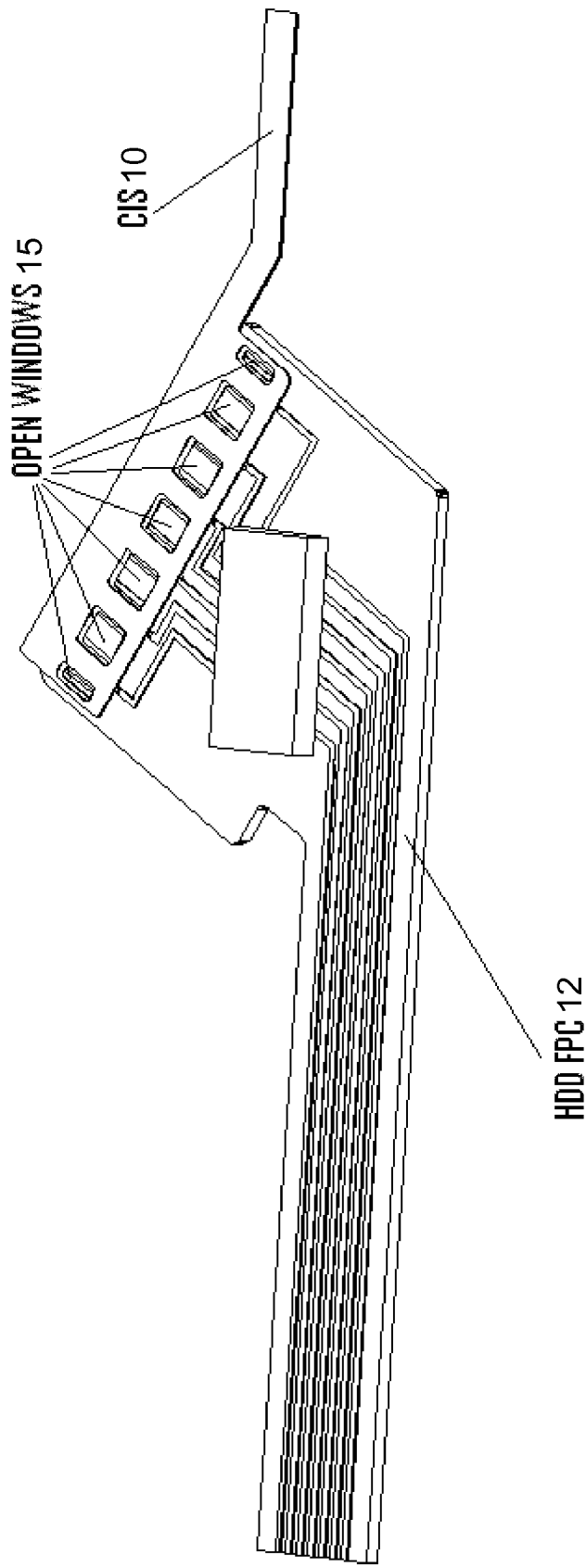
FIG. 10 depicts an example of the CIS positioned over the FPC, wherein the CIS has alignment windows according to an embodiment of the invention.

FIG. 10 depicts an example of the CIS 10 positioned over an FPC 12, wherein the CIS 10 has alignment windows 15 according to an embodiment of the invention. As illustrated in FIG. 10, the alignment of the CIS 10 and FPC 12 can be confirmed using the alignment windows 15.

What is claimed is:

1. A circuit integrated suspension (CIS) comprising:
    a steel backing layer;
    an insulating layer provided over the steel backing layer;
    a conductive circuitry provided over the insulating layer;
    inspection cutouts provided in the steel backing layer and in the insulating layer, said inspection cutouts located to enable visual inspection of selected areas of the conductive circuitry;
    wherein the inspection cutouts are of sufficient width such that alignment of the CIS with a flexible printed circuit (FPC) can be visually confirmed through the inspection cutouts after soldering is conducted;
    wherein the FPC comprises FPC conductive pads and an FPC substrate layer, wherein the FPC substrate layer is visible through the inspection cutouts after soldering is conducted.

2. The CIS of claim 1, wherein said steel backing layer comprises stainless steel.

3. The CIS of claim 2 wherein said insulating layer comprises polyimide.

4. The CIS of claim 3 wherein said conductive circuitry comprises copper.

5. The CIS of claim 1, further comprising solder-wicking holes provided in the conductive circuitry.

6. The CIS of claim 1, wherein the conductive circuitry comprises conductive pads and wherein the insulating layer is narrower than the conductive pads.

7. The CIS of claim 1, wherein the conductive circuitry comprises conductive pads and the cutouts are sized so as to expose edges of the conductive pads.

8. The CIS of claim 1, wherein the cutouts are rectangular.

9. The CIS of claim 1, wherein the cutouts are circular.

10. A combination circuit integrated suspension (CIS) and flexible printed circuit (FPC), comprising:
    a CIS comprising a CIS steel backing layer, a CIS insulating layer provided over the CIS steel backing layer, and a plurality of CIS conductive pads provided over the CIS insulating layer;
    an FPC comprising an FPC insulating layer and a plurality of FPC conductive pads;
    wherein selected ones of the plurality of CIS conductive pads are soldered to corresponding ones of the plurality of FPC conductive pads, and wherein inspection cutouts are provided in the CIS steel backing layer and in the CIS insulating layer to enable visual inspection of at least some of the selected ones of the plurality of CIS conductive pads that are soldered to the corresponding ones of the plurality of FPC conductive pads;
    wherein the inspection cutouts are of sufficient width such that alignment of the selected ones of the plurality of CIS conductive pads and the corresponding ones of the plurality of FPC conductive pads can be visually confirmed through the inspection cutouts after soldering is conducted;
    wherein the FPC insulating layer is visible through the inspection cutouts after soldering is conducted.

11. The combination of claim 10, wherein the cutouts are sized so as to expose edges of the plurality of CIS conductive pads.

12. The combination of claim 10, wherein the cutouts are rectangular.

13. A method for manufacturing circuit integrated suspension (CIS) comprising:
    providing a steel backing layer;
    providing an insulating layer over the steel backing layer;
    providing a plurality of CIS conductive pads over the insulating layer for soldering on to corresponding flexible printed circuit (FPC) conductive pads;
    providing cutouts in the insulating layer to enable visual inspection of at least some of the plurality of contact pads;
    wherein the cutouts in the insulating layer are of sufficient width such that alignment of the plurality of CIS conductive pads and the corresponding FPC conductive pads can be visually confirmed through the cutouts after the soldering is conducted;
    wherein an FPC substrate layer disposed beneath the corresponding FPC conductive pads is visible through the cutouts after soldering is conducted.

14. The method of claim 13, wherein the cutouts are sized so as to expose edges of the plurality of CIS conductive pads.

15. A method for manufacturing a combination of circuit integrated suspension (CIS) and flexible printed circuit FPC, comprising:
    providing a CIS steel backing layer;
    providing a CIS insulating layer over the CIS steel backing layer;
    providing a plurality of CIS conductive pads over the CIS insulating layer;

providing cutouts in the CIS insulating layer to enable visual inspection of at least some of the plurality of CIS conductive pads;

providing an FPC comprising an FPC insulating layer and a plurality of FPC conductive pads;

soldering at least selected ones of the plurality of CIS conductive pads to corresponding ones of the plurality of FPC conductive pads;

inspecting the quality of the soldering via the cutouts;

wherein the cutouts in the CIS insulating layer are of sufficient width such that alignment of the selected ones of the plurality of CIS conductive pads and the corresponding ones of the plurality of FPC conductive pads can be visually confirmed through the cutouts after soldering is conducted;

wherein the FPC insulating layer is visible through the cutouts after soldering is conducted.

16. The combination of claim 15, wherein the cutouts are sized so as to expose edges of the plurality of CIS conductive pads.

17. The method of claim 15, wherein the plurality of FPC conductive pads and the plurality of CIS conductive pads are dog bone shaped.

18. A method for manufacturing circuit integrated suspension (CIS) comprising:

fabricating a combination of insulation layer sandwiched between a backing layer and a conductive pads layer, the conductive pads layer comprising a plurality of CIS conductive pads for soldering on to corresponding FPC pads;

fabricating cut-out holes in the combination to enable visual inspection of the conductive pads layer from the backing layer side;

wherein the cut-out holes are of sufficient width such that alignment of the plurality of CIS conductive pads and the corresponding FPC conductive pads can be visually confirmed through the cut-out holes after soldering is conducted;

wherein an FPC substrate layer disposed beneath the corresponding FPC conductive pads is visible through the cutouts after soldering is conducted.

19. The method of claim 18, wherein the cut-out holes are cut in the backing layer and in the insulation layer.

20. The method of claim 19, further comprising fabricating solder-wicking holes in the conductive pads layer.

* * * * *